(12) United States Patent
Wallis

(10) Patent No.: US 10,084,416 B2
(45) Date of Patent: Sep. 25, 2018

(54) APPARATUS AND METHODS FOR OVERLOAD PROTECTION OF LOW NOISE AMPLIFIERS

(71) Applicant: SKYWORKS SOLUTIONS, INC., Woburn, MA (US)

(72) Inventor: Leslie Paul Wallis, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/458,423

(22) Filed: Mar. 14, 2017

(65) Prior Publication Data

US 2017/0279415 A1  Sep. 28, 2017

Related U.S. Application Data

(60) Provisional application No. 62/313,549, filed on Mar. 25, 2016.

(51) Int. Cl.
  *H03F 1/52* (2006.01)
  *H03F 3/195* (2006.01)
  *H03F 3/213* (2006.01)

(52) U.S. Cl.
  CPC ............ *H03F 1/523* (2013.01); *H03F 3/195* (2013.01); *H03F 3/213* (2013.01); *H03F 2200/294* (2013.01); *H03F 2200/451* (2013.01); *H03F 2200/471* (2013.01)

(58) Field of Classification Search
  CPC ........................................................ H03F 1/52
  USPC ............................................. 330/298, 207 P
  See application file for complete search history.

(56) References Cited

U.S. PATENT DOCUMENTS

| 4,859,967 | A | * | 8/1989 | Swanson | .................. | H03F 1/523 330/207 P |
| 5,847,610 | A | * | 12/1998 | Fujita | ....................... | H03F 1/52 330/207 P |
| 6,188,277 | B1 | * | 2/2001 | Borodulin | .................. | H03F 1/52 330/107 |
| 6,744,310 | B2 | * | 6/2004 | Honda | .................... | H03F 1/523 330/2 |
| 7,348,854 | B1 | | 3/2008 | Mordkovich | | |
| 7,515,000 | B1 | | 4/2009 | Jin et al. | | |
| 8,362,840 | B2 | | 1/2013 | Andrys et al. | | |

(Continued)

FOREIGN PATENT DOCUMENTS

JP  2008-054260 A  3/2008

*Primary Examiner* — Henry Choe
(74) *Attorney, Agent, or Firm* — Knobbe Martens Olson & Bear LLP

(57) ABSTRACT

Apparatus and methods for overload protection of low noise amplifiers (LNAs) are provided herein. In certain configurations, an LNA system includes an input switch having an analog control input that controls an impedance of the input switch, an LNA that amplifies a radio frequency (RF) input signal received from the input switch, and an overload protection circuit that provides feedback to the input switch's analog control input based on detecting a signal level of the LNA. The overload protection circuit detects whether or not the LNA is overloaded. Additionally, when the overload protection circuit detects an overload condition, the overload protection circuit provides feedback to the analog control input of the switch to increase the impedance of the switch and reduce the magnitude of the RF input signal received by the LNA.

20 Claims, 9 Drawing Sheets

(56) References Cited

U.S. PATENT DOCUMENTS

| | | |
|---|---|---|
| 8,610,503 B2 | 12/2013 | Kaczman et al. |
| 9,595,926 B2 | 3/2017 | Quaglietta |
| 2008/0239597 A1 | 10/2008 | Van Bezooijen et al. |
| 2011/0291765 A1 | 12/2011 | Sun et al. |
| 2011/0292554 A1 | 12/2011 | Yao et al. |
| 2016/0094192 A1* | 3/2016 | Khesbak .............. H04B 1/0475 455/73 |
| 2018/0026592 A1 | 1/2018 | Wallis |

* cited by examiner

APPARATUS AND METHODS FOR OVERLOAD PROTECTION OF LOW NOISE AMPLIFIERS

CROSS-REFERENCE TO RELATED APPLICATIONS

This application claims the benefit of priority under 35 U.S.C. § 119(e) of U.S. Provisional Patent Application No. 62/313,549, filed Mar. 25, 2016 and titled "APPARATUS AND METHODS FOR OVERLOAD PROTECTION OF LOW NOISE AMPLIFIERS," which is herein incorporated by reference in its entirety.

BACKGROUND

Field

Embodiments of the invention relate to electronic systems, and in particular, to radio frequency (RF) electronics.

Description of Related Technology

A low noise amplifier (LNA) can be used to boost the amplitude of a relatively weak radio frequency (RF) signal received over an antenna. Thereafter, the boosted RF signal can be used for a variety of purposes, including, for example, driving a switch, a mixer, and/or a filter of an RF system.

LNAs can be included in RF systems to provide low noise amplification to signals of a wide range of frequencies. For example, an LNA can be used to provide low noise amplification to RF signals in a frequency range of about 30 kHz to 300 MHz, such as in the range of about 450 MHz to about 4 GHz for certain communications standards.

SUMMARY

In certain embodiments, the present disclosure relates to a low noise amplifier system including an input switch having an analog control input operable to control an impedance of the input switch, a low noise amplifier configured to provide amplification to a radio frequency input signal received from the input switch, and an overload protection circuit configured to provide feedback to the analog control input of the input switch based on a detected signal level of the low noise amplifier.

In various embodiments, the overload protection circuit is configured to increase the impedance of the input switch to reduce a magnitude of the radio frequency input signal in response to determining that the detected signal level indicates an overload condition.

In a number of embodiments, the low noise amplifier system further includes a limiter enable circuit configured to selectively connect an output of the overload protection circuit to the analog control input based on a state of one or more digital control signals. In several embodiments, the one or more digital control signals includes a switch enable signal, and the limiter enable circuit is configured to disconnect the output of the overload protection circuit from the analog control input and turn off the input switch when the switch enable signal is disabled.

In some embodiments, the overload protection circuit includes a detector configured to generate a detection signal indicating the detected signal level of the low noise amplifier, and an error amplifier configured to provide feedback to the analog control input based on amplifying a difference between the detection signal and a reference signal. In various embodiments, the detector includes a bipolar transistor configured to saturate in response to an overload condition of the low noise amplifier. In accordance with certain embodiments, the detector further includes a capacitor configured to filter a current flowing through the bipolar transistor, and the detector is configured to generate the detection signal based on a voltage across the capacitor.

In several embodiments, the detected signal level includes an output signal level of the low noise amplifier.

In a number of embodiments, the detected signal level includes an internal signal level of the low noise amplifier.

In certain embodiments, the present disclosure relates to a packed front end module including a packaging substrate and an integrated circuit attached to the packaging substrate. The integrated circuit includes an input switch having an analog control input operable to control an impedance of the input switch, a low noise amplifier configured to provide amplification to a radio frequency input signal received from a first throw of the input switch, and an overload protection circuit configured to provide feedback to the analog control input of the input switch based on a detected signal level of the low noise amplifier.

In various embodiments, the overload protection circuit is configured to increase the impedance of the input switch to reduce a magnitude of the radio frequency input signal in response to determining that the detected signal level indicates an overload condition.

In a number of embodiments, the integrated circuit further includes a limiter enable circuit configured to selectively connect an output of the overload protection circuit to the analog control input based on a state of one or more digital control signals. In several embodiments, the one or more digital control signals includes a switch enable signal, and the limiter enable circuit is configured to disconnect the output of the overload protection circuit from the analog control input and turn off the input switch when the switch enable signal is disabled.

In accordance with some embodiments, the overload protection circuit includes a detector configured to generate a detection signal indicating the detected signal level of the low noise amplifier, and an error amplifier configured to provide feedback to the analog control input based on amplifying a difference between the detection signal and a reference signal.

In various embodiments, the integrated circuit further includes a bypass path electrically connected to a second throw of the input switch.

According to several embodiments, the integrated circuit further includes a power amplifier configured to provide an amplified radio frequency signal to a third throw of the input switch.

In certain embodiments, the present disclosure relates to a method of overload protection in a low noise amplifier system. The method includes providing a radio frequency input signal from an input switch to a low noise amplifier, the input switch including an analog control input that controls an impedance of the input switch. The method further includes amplifying the radio frequency input signal using the low noise amplifier, detecting a signal level of the low noise amplifier using an overload protection circuit, and providing feedback to the analog control input to increase the impedance of the input switch in response to detecting an overload condition of the signal level using the overload protection circuit.

In some embodiments, the method further includes disconnecting the output of the overload protection circuit from the analog control input when a switch enable signal is disabled.

In various embodiments, detecting the signal level of the low noise amplifier includes monitoring an internal signal swing of the low noise amplifier.

In a number of embodiments, detecting the signal level of the low noise amplifier includes generating a detection signal using a detector, and amplifying a difference between the detection signal and a reference signal using an error amplifier.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
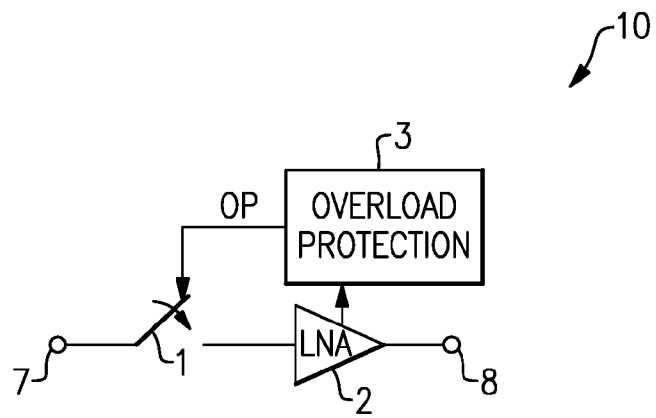
FIG. 1 is a schematic diagram of a low noise amplifier (LNA) system according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Large input signals can cause overload conditions to arise in a low noise amplifier (LNA). For example, in certain applications, an LNA is specified to tolerate a high overload signal that is substantially higher than a normal operating signal level.

Absent an overload protection scheme, providing a large input signal to an LNA can result in high current and/or voltage manifesting in circuitry of the LNA, such as transistors used for amplification. Such high current and/or voltage can cause permanent electrical overstress damage to the amplification transistors such that they are no longer able to operate and/or such that their operation is impaired.

Apparatus and methods for overload protection of LNAs are provided herein. In certain configurations, an LNA system includes an input switch having an analog control input that controls an impedance of the input switch, an LNA that amplifies a radio frequency (RF) input signal received from the input switch, and an overload protection circuit that provides feedback to the input switch's analog control input based on detecting a signal level of the LNA. The overload protection circuit detects whether or not the LNA is overloaded. Additionally, when the overload protection circuit detects an overload condition, the overload protection circuit provides feedback to the analog control input of the switch to increase the impedance of the switch and reduce the magnitude of the RF input signal received by the LNA.

The overload protection schemes herein can be used to limit large current and/or voltage swing conditions manifesting within circuitry of an LNA.

In certain implementations, the input switch is also used for controlling signal connectivity and/or routing. For example, the input switch can be part of a multi-throw switch used to facilitate routing of signals transmitted and received via an antenna. Using the input switch for both overload protection and signal routing can reduce overhead and/or enhance performance by sharing circuitry for multiple functions. For example, using an input switch that is already in a receive signal path provides overload protection without increasing the insertion loss of the receive path. Thus, the overload protection circuit has no or a relatively small impact on the LNA's performance.

The teachings herein can be used to control the impedance of an input switch to attenuate an incoming RF signal to a safe level. For an input switch, such as a metal-oxide-semiconductor (MOS) transistor switch, an analog control input can be used to control the input switch's impedance. For example, the impedance of a MOS transistor switch can be controlled based on an analog voltage level provided to the MOS transistor's gate.

In certain implementations herein, the overload protection circuit controls the analog control input of the input switch with an overload protection signal that is based on a detected signal level of the LNA, such as an input signal level, internal signal level, and/or output signal level. Additionally, the overload protection circuit provides feedback to the input switch's analog control input via the overload protection signal to prevent a large input signal from damaging the LNA.

In certain configurations, the impedance of the input switch can be controlled based not only on the overload protection signal from the overload protection circuit, but also on one or more digital control signals. For example, in certain implementations, the overload protection circuit includes a limiter enable circuit connected between an output of the overload protection circuit and the analog control input to the input switch. The limiter enable circuit controls the input switch based on one or more digital control signals, such as a switch enable signal and/or limiter enable signal. For example, the limiter enable circuit can be used to disconnect the overload protection circuit from the analog control input when the input switch is in an off state and/or when overload protection is disabled.

The signal level of the LNA can be detected in a wide variety of ways, such as by using any suitable signal detector. For example, a signal detector can be used to detect an input signal level of the LNA, an internal signal level of the LNA, and/or an output signal level of the LNA. For instance, detection at the LNA's output avoids noise figure degradation, but can degrade the LNA's linearity. In contrast, detection at the LNA's input may degrade noise figure. Detection at the output also relaxes design constraints of the detector, since the output signal level is higher than the input signal level.

In certain implementations, the LNA includes an output rectifier circuit that clips or limits an output voltage level of the LNA. Including the output rectifier circuit can enhance performance, since the output rectifier circuit can have a faster turn-on time relative to a time taken by feedback from the overload protection circuit to increase the impedance of the input switch. In one example, the output rectifier is implemented using clamping diodes. Once the overload protection circuit's control loop responds to provide feedback, the signal level is turned down or decreased to a safe level via control of the impedance of the input switch.

A network or circuit connected in shunt with a signal path can impact overall noise or linearity performance. By providing overload protection using an input switch already present, the LNA need not include an additional circuit in shunt or series to protect against overload.

The overload protection circuits herein can provide signal attenuation at the LNA's input via increasing impedance of the input switch. Accordingly, the overload protection schemes herein can be used to protect against both high voltage and high current. Furthermore, reducing the RF input signal to the LNA protects all circuitry of the LNA. In contrast, an implementation using only an output voltage clamp may not fully protect certain circuits of the LNA and/or high currents may nevertheless flow in the LNA when clamping.

The LNA overload protection schemes disclosed herein are applicable to a wide variety of RF systems, including, but not limited to, smartphones, base stations, handsets, wearable electronics, and/or tablets.

FIG. 1 is a schematic diagram of an LNA system 10 according to one embodiment. The LNA system 10 includes an input switch 1, an LNA 2, and an overload protection circuit or signal limiter 3. The LNA system 10 further includes an input terminal 7 and an output terminal 8.

The LNA 2 provides amplification to an RF input signal received from the input terminal 7 via the input switch 1. The LNA 2 provides an amplified RF output signal on the output terminal 8. In certain configurations, the input terminal 7 is electrically connected to an antenna and the output terminal 8 is electrically connected to a transceiver. For instance, the transceiver can include a demodulator that downconverts the amplified RF output signal from the LNA 2 to baseband or an intermediate frequency.

The input switch 1 includes an analog control input used to control the input switch's impedance between the input terminal 7 and an input to the LNA 2. In certain configurations, the input switch 1 includes at least one metal-oxide-semiconductor (MOS) transistor having a gate that serves as the analog control input. By controlling an analog gate voltage of the MOS transistor, an impedance of the input switch can be controlled.

As shown in FIG. 1, the overload protection circuit 3 detects a signal level of the LNA 2 to determine whether or not an overload condition is present. Additionally, the overload protection circuit 3 generates an overload protection signal OP operable to provide feedback to the analog control input of the switch 1. When the overload protection circuit 3 detects an overload condition, the overload protection circuit 3 increases the impedance of the input switch 1, thereby reducing the magnitude of the RF input signal received by the LNA 2. Thus, the overload protection circuit 3 serves as a signal limiter that limits large current and voltage swing conditions manifesting within amplification transistors of the LNA 2.

In certain implementations, the input switch 1 corresponds to part of a multi-throw switch used to facilitate routing of signals transmitted and received via an antenna. For example, the input terminal 7 can be connected to an antenna of a wireless device. Using the input switch 1 for both overload protection and routing signals can reduce overhead and/or enhance performance. Thus, during normal signaling conditions when no overload condition is present, the overload protection circuit 3 has no or a relatively small impact on the performance of the LNA 2. For instance, since the input switch 1 is included for signal routing, the overload protection scheme need not increase an insertion loss between the input terminal 7 and the output terminal 8.

Although not illustrated in FIG. 1, the LNA system 10 can include other components and/or circuitry. For example, in one embodiment, the LNA system 10 further includes a limiter enable circuit connected between the output of the overload protection circuit 3 and the analog control input to the input switch 1. In certain implementations, the limiter enable circuit can be used to selectively connect the output of the overload protection circuit 3 and the input switch's analog control input based on a state of a switch enable signal.

Figure 2A:
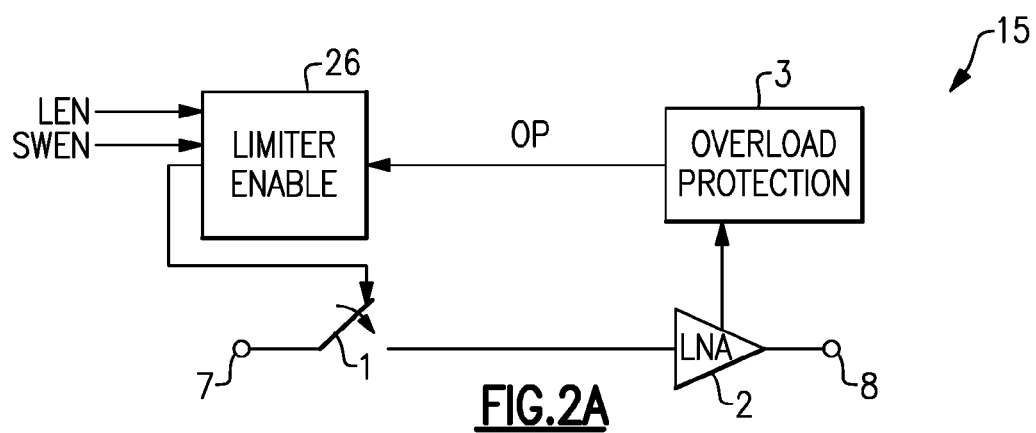
FIG. 2A is a schematic diagram of an LNA system according to another embodiment.

FIG. 2A is a schematic diagram of an LNA system 15 according to another embodiment. The LNA system 15 of FIG. 2A includes the input terminal 7, the output terminal 8, the input switch 1, the LNA 2, and the overload protection circuit 3, which can be as described earlier. The LNA system 15 further includes a limiter enable circuit 26.

The LNA system 15 of FIG. 2A is similar to the LNA system 10 of FIG. 1, except that the LNA system 15 further includes the limiter enable circuit 26. As shown in FIG. 2A, the limiter enable circuit 26 receives a limiter enable signal LEN and a switch enable signal SWEN, in this embodiment. Although FIG. 2A illustrates one example of digital control signals for a limiter enable circuit, other implementations are possible.

The limiter enable circuit 26 receives the overload protection signal OP from the overload protection circuit 3. The limiter enable signal LEN can be used to selectively enable overload protection/signal limiter functionality based on a state of digital control signals received by the limiter enable circuit 26.

In the illustrated embodiment, when the switch enable signal SWEN and limiter enable signal LEN are enabled, the limiter enable circuit 26 provides the overload protection signal OP to the analog control input of the input switch 1. However, when the switch enable signal SWEN is disabled, the limiter enable circuit 26 controls the analog control input to turn off the input switch 1. Additionally, when the limiter enable signal LEN is disabled, the input switch 1 can be turned on or off based on the state of the switch enable signal SWEN.

Including the limiter enable circuit 26 between the output of the overload protection circuit 3 and the analog control input of the input switch 1 provides a number of advantages. For example, the limiter enable circuit 26 allows the switch state to be controlled by a logic signal, while also allowing the overload protection circuit 3 to provide feedback to the input switch's analog control input when desired.

For example, when the switch enable signal SWEN is in a disabled state, the limiter enable circuit 26 disconnects the output of the overload protection circuit 3 from the analog control input and turns off the input switch 1. However, when the switch enable signal SWEN and the limiter enable signal LEN are in enabled states, the limiter enable circuit 26 connects the output of the overload protection circuit 3 to the analog control input of the input switch 1.

Figure 2B:
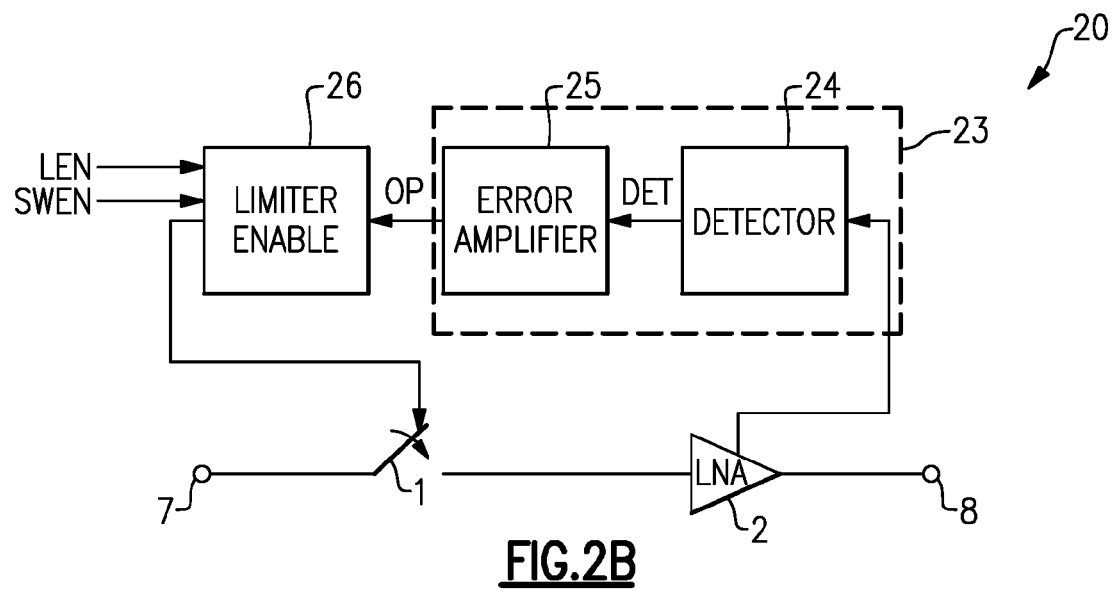
FIG. 2B is a schematic diagram of an LNA system according to another embodiment.

FIG. 2B is a schematic diagram of an LNA system 20 according to another embodiment. The LNA system 20 includes the input terminal 7, the output terminal 8, the input switch 1, the LNA 2, and the limiter enable circuit 26, which can be as described earlier. The LNA system 20 further includes an overload protection circuit or signal limiter 23.

The illustrated overload protection circuit 23 includes a detector 24 and an error amplifier 25. The detector 24 generates a detection signal DET based on detecting a signal level of the LNA 2. The detector 24 can sense the signal level of the LNA 2 in a wide variety of ways, including, for example, output signal detection, input signal detection, and/or detection of an intermediate voltage and/or current.

As shown in FIG. 2B, the error amplifier 25 amplifies the detection signal DET to generate an overload protection signal OP, which is provided to the limiter enable circuit 26. In certain implementations, the error amplifier 25 amplifies a difference between the detection signal DET and a reference signal.

Although FIG. 2B illustrates one embodiment of an overload protection circuit, the overload protection circuits herein can be implemented in a wide variety of ways.

Figure 3A:
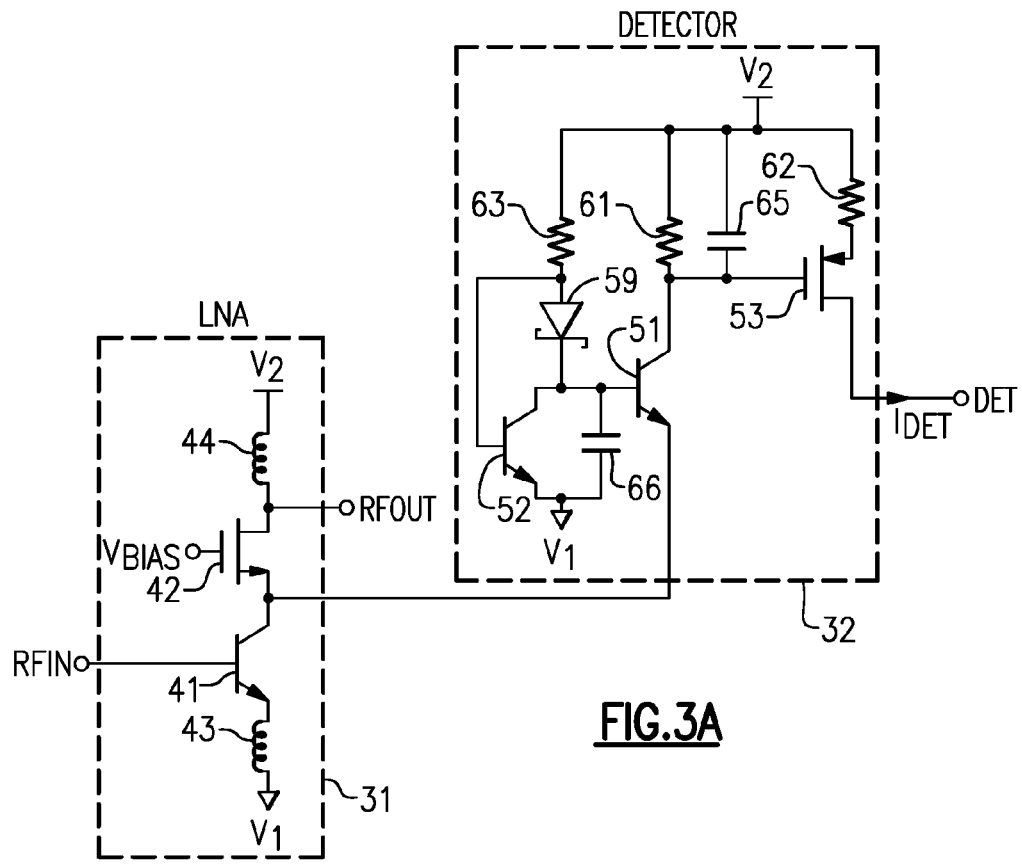
FIG. 3A is a schematic diagram of an LNA and a detector according to one embodiment.

FIG. 3A is a schematic diagram of an LNA 31 and a detector 32 according to one embodiment. The LNA 31 includes an LNA input RFIN and an LNA output RFOUT. The detector 32 includes a detector input coupled to an internal node of the LNA 31 and a detector output DET.

The LNA 31 further includes an amplification NPN transistor 41, a cascode n-type metal-oxide-semiconductor (NMOS) transistor 42, an emitter degeneration inductor 43, and a biasing inductor 44. Although one implementation of an LNA is shown in FIG. 3A, the teachings herein are applicable to LNAs implemented in a wide variety of ways, including but not limited to, LNAs using more or fewer transistors and/or transistors of different device types and/or polarities.

As shown in FIG. 3A, the base of the amplification NPN transistor 41 is connect to the LNA input RFIN, and the collector of the amplification NPN transistor 41 is connected to a source of the cascode NMOS transistor 42. The emitter degeneration inductor 43 is electrically connected between an emitter of the amplification NPN transistor 41 and a first voltage $V_1$ (for instance, ground), and the biasing inductor 44 is electrically connected between a drain of the cascode NMOS transistor 42 and a second voltage $V_2$ (for instance, a power supply). The gate of the cascode NMOS transistor 42 is biased by a bias voltage $V_{BIAS}$ and the drain of the cascode NMOS transistor 42 is connected to the LNA output RFOUT. For clarity of the figures, bias circuitry of the LNA 31 has not been shown. However, the LNA 31 can be biased in a wide variety of ways.

The illustrated detector 32 includes a first detection NPN transistor 51, a second detection NPN transistor 52, a detection p-type metal-oxide-semiconductor (PMOS) transistor 53, a Schottky diode 59, a first resistor 61, a second resistor 62, a third resistor 63, a first capacitor 65, and a second capacitor 66. Although one implementation of a detector is shown in FIG. 3A, the teachings herein are applicable to detectors implemented in a wide variety of ways.

In the illustrated embodiment, the detector 32 generates a detection current $I_{DET}$ at the detector output DET. The magnitude of the detection current $I_{DET}$ is based on a detected signal level of the LNA 31, and in particular to a signal swing at the collector of the amplification NPN transistor 41. However, a signal detector can detect an LNA's signal level in other ways. Moreover, although the illustrated detector 32 generates a detection current, other configurations are possible, including but not limited to, implementations in which a detector generates a detection voltage.

At high signal power the voltage at the collector of the amplification NPN transistor 41 saturates the first detection NPN transistor 51, which gives rise to a flow of rectified current through the first detection NPN transistor 51. The rectified current is filtered by the first capacitor 65 to generate a voltage the controls a gate of the detection PMOS transistor 53. Thus, when the LNA 31 is in overload, a detection current $I_{DET}$ flows from the detector 32.

The illustrated embodiment depicts one implementation of an LNA and detector suitable for use in an LNA system, such as the LNA system 20 of FIG. 2B. Although FIG. 3A illustrates one embodiment of an LNA and detector, the teachings herein are applicable to LNAs and detectors implemented in a wide variety of ways.

Figure 3B:
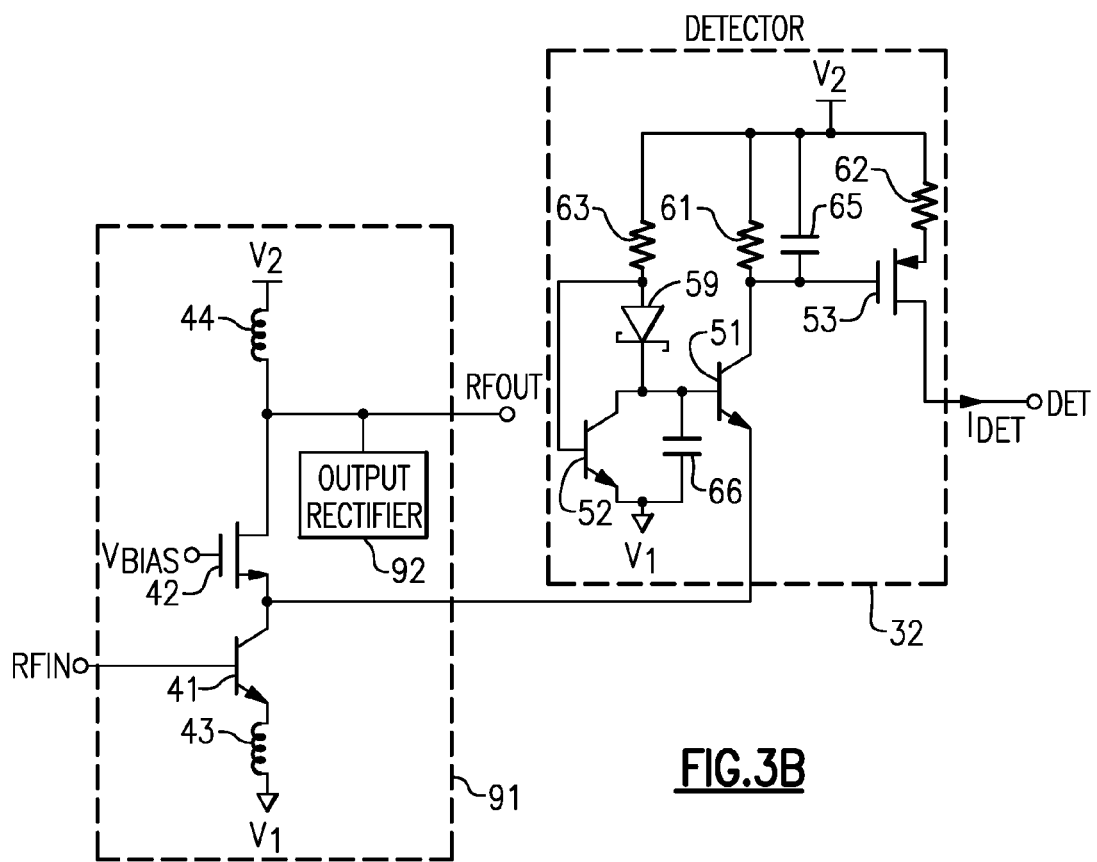
FIG. 3B is a schematic diagram of an LNA and a detector according to another embodiment.

FIG. 3B is a schematic diagram of an LNA 91 and a detector 32 according to another embodiment. The schematic diagram of FIG. 3B is similar to the schematic diagram of FIG. 3A, except that the LNA 91 of FIG. 3B further includes an output rectifier circuit 92 electrically connected to the LNA output RFOUT.

In certain implementations, such as the embodiment of FIG. 3B, an LNA is protected not only using an overload protection circuit that provides feedback to an input switch, but also using an output rectifier circuit that clips or limits an output voltage level of the LNA. Including the output rectifier circuit can enhance performance, since the output rectifier circuit can have a faster turn-on time relative to a time taken by feedback from the overload protection circuit to increase the impedance of the input switch. Once the overload protection circuit's control loop responds to provide feedback, the signal level is turned down or decreased to a safe level via control of the impedance of the input switch.

In one embodiment, the output rectifier circuit 92 is implemented using clamping diodes. For example, the output rectifier can include one or more diode networks electrically connected between the LNA output RFOUT and one or more reference voltages, for instance, between the LNA output RFOUT and the first voltage $V_1$ and/or between the LNA output RFOUT and the second voltage $V_2$.

Figure 4:
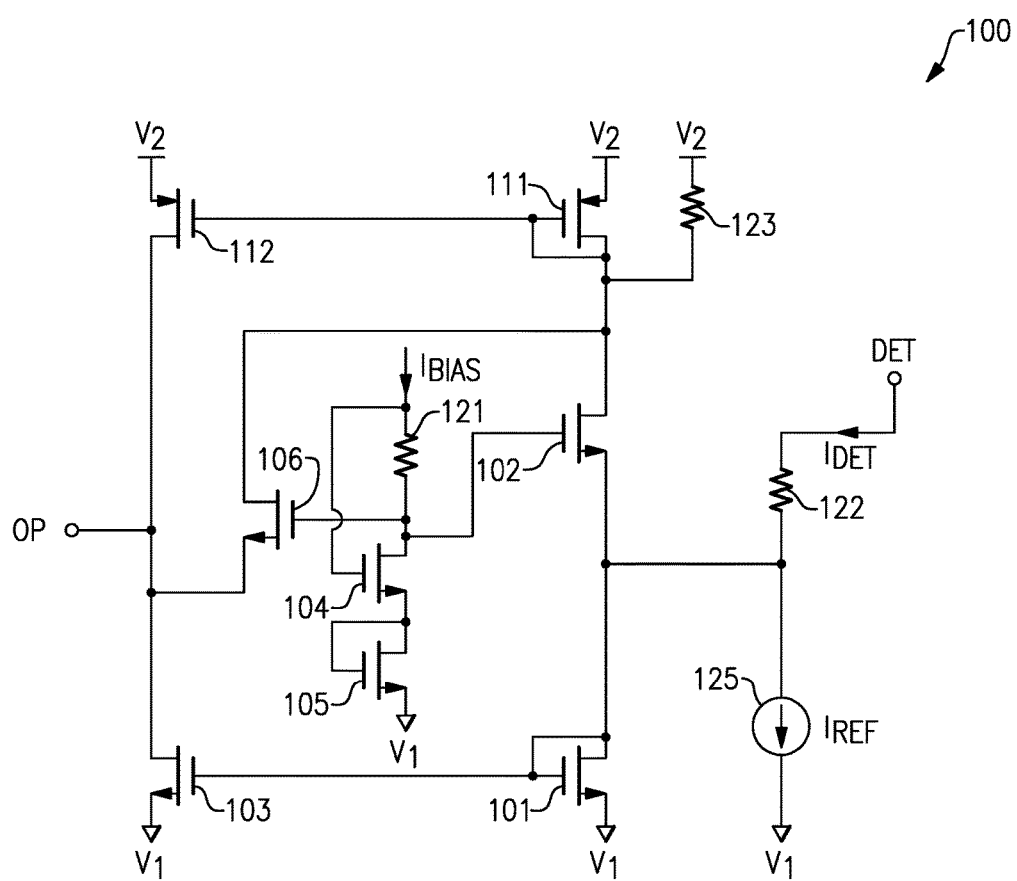
FIG. 4 is a schematic diagram of an error amplifier according to one embodiment.

FIG. 4 is a schematic diagram of an error amplifier 100 according to one embodiment. The error amplifier 100 includes a first NMOS transistor 101, a second NMOS transistor 102, a third NMOS transistor 103, a fourth NMOS transistor 104, a fifth NMOS transistor 105, a sixth NMOS transistor 106, a first PMOS transistor 111, a second PMOS transistor 112, a first resistor 121, a second resistor 122, a third resistor 123, and a reference current source 125. The error amplifier 100 includes a detection input DET for receiving a detection signal from a detector. The error amplifier 100 further includes an overload protection output OP, which can be used to control an analog control input of an input switch.

In the illustrated embodiment, a detection current $I_{DET}$ from a detector (for example, the detector 32 of FIGS. 3A-3B) is received by the error amplifier 100. When the detection current $I_{DET}$ is greater than the reference current $I_{REF}$ of the reference current source 125, the second NMOS transistor 102 can turn off and the first NMOS transistor 101 can conduct. Since the first and third NMOS transistors 101, 103 operate as a first current mirror and the first and second PMOS transistors 111, 112 operate as a second current mirror, the overload protection output OP is pulled down when the detection current $I_{DET}$ is greater than the reference current $I_{REF}$.

The first resistor 121 aids in preventing the first and second NMOS transistors 101, 102 from simultaneously conducting. For example, the first resistor 121 operates in conjunction with the fourth and fifth NMOS transistors 104, 105 to bias the first and second NMOS transistors 101, 102 near conduction, while inhibiting simultaneously conduction. This in turn prevents a continuously linear closed loop when the error amplifier 100 is connected in a feedback loop from an LNA to an analog control input of an input switch. As shown in FIG. 4, a bias current $I_{BIAS}$ is used to bias the first resistor 121 and the fourth and fifth NMOS transistors 104, 105.

At very high input power to an LNA, a detector can generate a relatively large detection signal, which can result in the overload protection output OP being controlled to the first voltage $V_1$. At intermediate input power levels, the circuit can exhibit blocking oscillator behavior. In certain implementations, there is no continuous linear signal path around the loop, but instead a switched oscillatory behavior.

In certain implementations, the feedback signal generated at the overload protection output OP can be provided to a limiter enable circuit (for example, the limiter enable circuit 26 of FIGS. 2A-2B), which in turn can selectively provide the feedback signal to an analog control input of an input switch. When a large input signal is present during an overload condition, the overload protection output OP goes low (in this embodiment), which in can turn off the input switch either fully or partially.

For example, the input switch includes an analog control input, and thus the magnitude of the input signal to an LNA can be controlled using the overload protection output OP. Since turning off the input switch partially reduces the input signal strength to the LNA and a corresponding value of the detector signal DET, a closed loop is provided. The closed loop exhibits different behavior at different input power levels. At very high power, the input switch is fully off and substantially no input signal is provided to the LNA. At intermediate power levels, when the loop exhibits some oscillatory behavior, the overload protection output OP can operate at a DC level with a superimposed AC component. In certain implementations, the input switch filters the AC component, since the input switch can be implemented to have a time constant lower than the period of the oscillatory signal. Accordingly, the loop can behave as though it were under linear control.

In certain configurations, the loop does not respond to any signal levels encountered in normal operation, only to higher overload conditions. The protection loop has a finite response time, and thus may not protect against instantaneous voltage peaks. However, the protection loop can limit total exposure of the LNA to high currents. In certain configurations, an LNA further includes an output rectifier to bolster protection against instantaneous voltage peaks.

In the illustrated embodiment, the overload protection output OP is normally high. However, when an overload condition is detected, the overload protection output OP is a continuously variable level, that can vary between the voltages of the first voltage $V_1$ and the second voltage $V_2$. The analog or continuous signal level of the overload protection output OP arises from the error amplifier 100 operating in a closed loop. The overload protection output OP is controlled to a voltage level that depends on an input power to the LNA and operating conditions, such as temperature.

The illustrated embodiment depicts one implementation of an error amplifier for use in an LNA system, such as the LNA system 20 of FIG. 2B. Although one embodiment of an error amplifier is shown in FIG. 4, an error amplifier can be implemented in other ways.

Figure 5A:
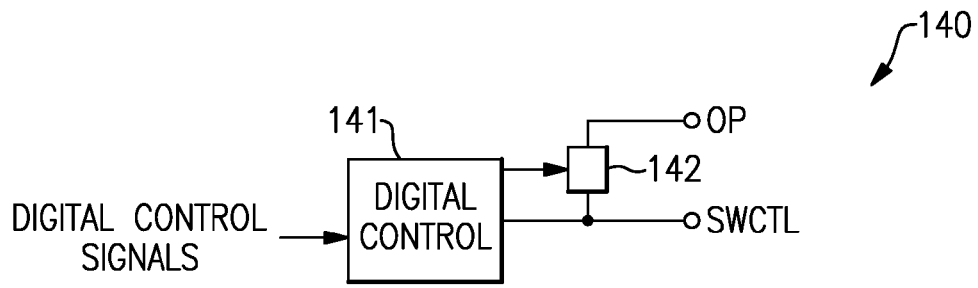
FIG. 5A is a schematic diagram of a limiter enable circuit according to one embodiment.

FIG. 5A is a schematic diagram of a limiter enable circuit 140 according to one embodiment. The limiter enable circuit 140 includes a digital control circuit 141 and a feedback enable circuit 142. The limiter enable circuit 140 receives an overload protection signal OP and one or more digital control signals, and generates a switch control signal SWCTL used to control an analog control input of an input switch, such as the input switch 1 of FIG. 1.

As shown in FIG. 5A, the digital control circuit 141 receives one or more digital control signals, which the digital control circuit 141 processes to control whether or not the feedback enable circuit 142 is turned on or off. When the feedback enable circuit 142 is turned on, the overload protection signal OP is used to control an analog voltage level of the switch control signal SWCTL. However, when feedback enable circuit 142 is turned off, the digital control circuit 141 digitally controls the switch control signal SWCTL.

Figure 5B:
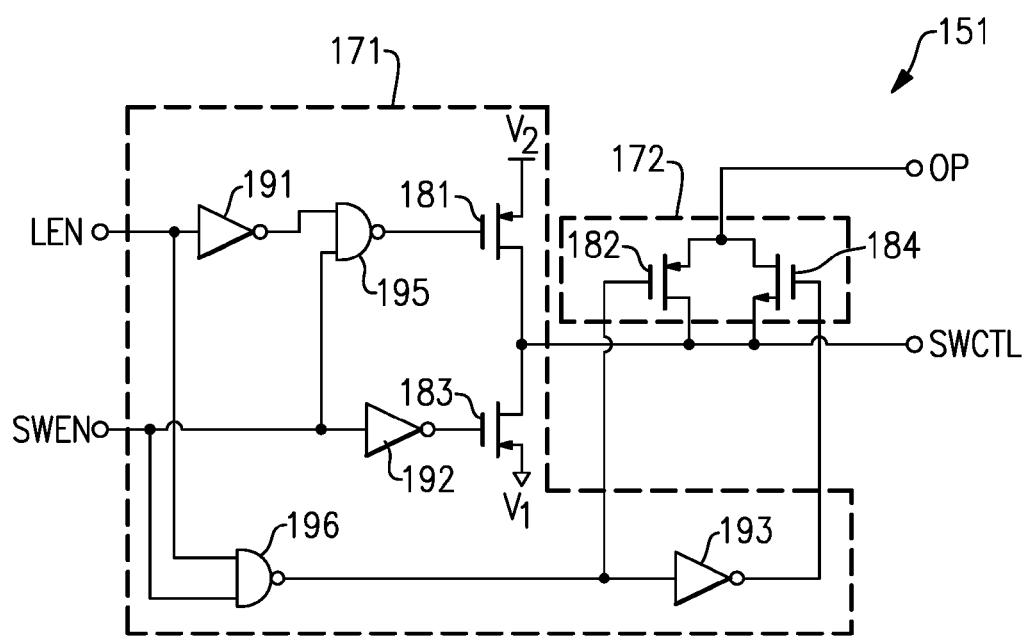
FIG. 5B is a schematic diagram of a limiter enable circuit according to another embodiment.

FIG. 5B is a schematic diagram of a limiter enable circuit 151 according to another embodiment. The limiter enable circuit 151 includes a digital control circuit 171 that includes a first inverter 191, a second inverter 192, a third inverter 193, a first NAND gate 195, a second NAND gate 196, a first PMOS transistor 181, and a first NMOS transistor 183. The limiter enable circuit 151 further includes a feedback enable circuit 172 that includes a second PMOS transistor 182 and a second NMOS transistor 184.

In the illustrated embodiment, the digital control circuit 171 receives a limiter enable signal LEN and a switch enable signal SWEN. The digital control circuit 171 controls whether or not the feedback enable circuit 172 is enabled based on a state of the limiter enable signal LEN and the switch enable signal SWEN, in this embodiment.

For example, in the illustrated embodiment, when the limiter enable signal LEN is logically low (corresponding to disabled, in this embodiment), the digital control circuit 171 turns off the feedback enable circuit 172 and digitally controls the switch control signal SWCTL to have the same state as the switch enable signal SWEN. Additionally, when the limiter enable signal LEN is logically low and the switch enable signal SWEN is logically low, the digital control circuit 171 shuts off the feedback enable circuit 172 and digitally controls the switch control signal SWCTL logically low, in this embodiment. However, when the limiter enable signal LEN and the switch enable signal SWEN are logically high, the digital control circuit 171 turns off the feedback enable circuit 172 and the overload protection signal OP controls the switch enable signal SWCTL.

Although FIG. 5B illustrates one embodiment of a limiter control circuit in accordance with the teachings herein, limiter control circuits can be implemented in a wide variety of ways. Moreover, the teachings herein are applicable to implementations in which a limiter control circuit is omitted.

Figure 6:
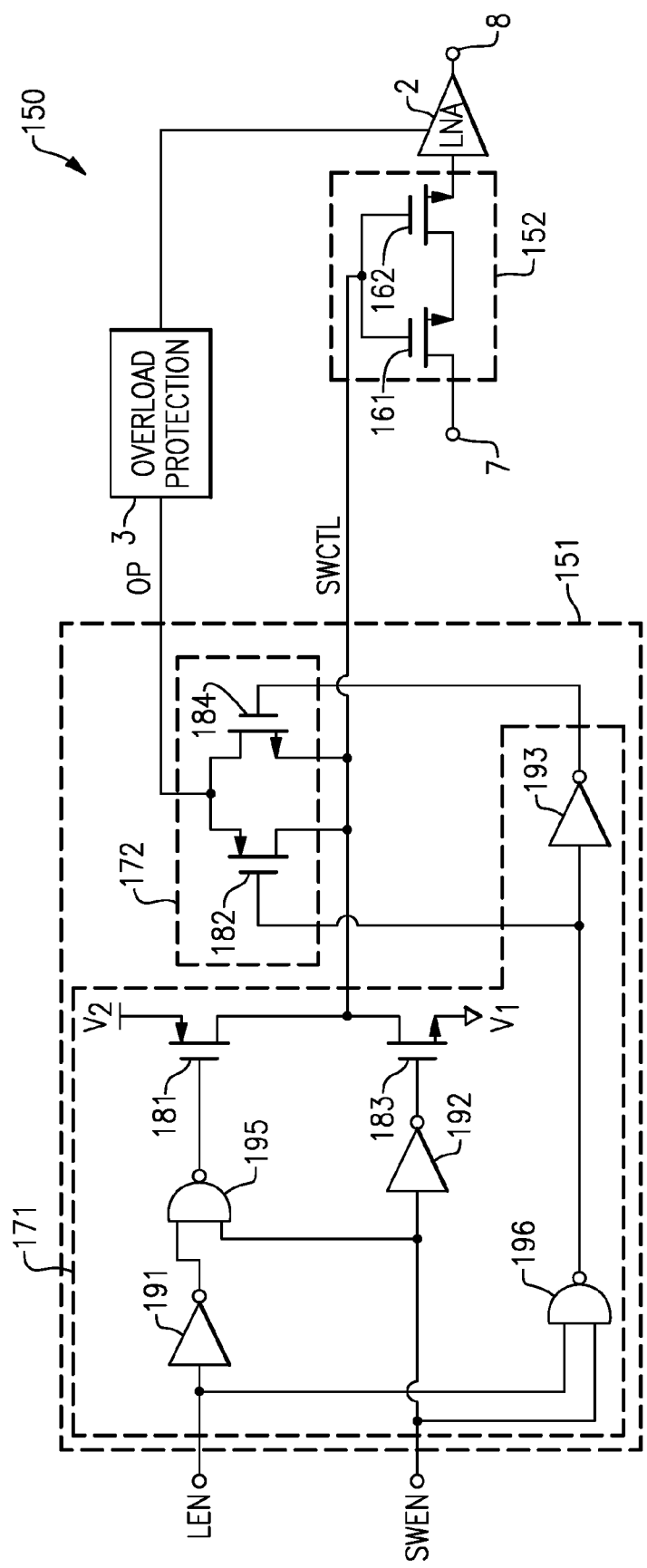
FIG. 6 is a schematic diagram of an LNA system according to another embodiment.

FIG. 6 is a schematic diagram of an LNA system 150 according to another embodiment. The LNA system 150 includes the input terminal 7, the output terminal 8, the LNA 2, the overload protection circuit 3, and the limiter enable circuit 151, which can be as described earlier. The LNA system 150 further includes an input switch 152.

The illustrated input switch 152 includes a first NMOS transistor 161 and a second NMOS transistor 162 electrically connected in series with one another. In the illustrated embodiment, the gates of the NMOS transistors 161, 162 serve as the analog control input to the input switch 152. Additionally, the RF input signals passes from the input terminal 7 to the input of the LNA 2 via the channels of the NMOS transistors 161, 162. Although one implementation of an input switch is shown, an input switch can be implemented in other ways.

As shown in FIG. 6, the limiter enable circuit 151 is connected between an output of the overload protection circuit or limiter 3 and the analog control input to the input switch 152. The logic of the limiter enable circuit 151 is implemented to disconnect the overload protection circuit 3 from the analog control input when the switch enable signal SWEN and/or limiter enable signal LEN is disabled.

Thus, the overload protection circuit 3 controls the analog control input of the input switch 152 when the switch enable signal SWEN and limiter enable signal LEN are enabled. However, when the switch enable signal SWEN is disabled, the limiter enable circuit 151 can control the analog control input to the first voltage $V_1$ (for instance, ground or a negative voltage), to turn off the input switch 152. Additionally, the limiter enable signal LEN is used to disable overload protection/signal limiter functionality. Thus, when the limiter enable signal LEN is disabled, the input switch 152 can be turned on or off based on the state of the switch enable signal SWEN.

The switch enable signal SWEN and limiter enable LEN can be generated in a variety of ways. In certain configurations, an integrated circuit (IC) includes one or more registers used to control a state of the switch enable signal SWEN and/or limiter enable LEN. For example, the one or more registers can be programmed by a transceiver over an interface, such as a serial peripheral interface. However, the switch enable signal SWEN and/or limiter enable signal LEN can be generated in other ways, such as being provided via pins of the IC.

Additional details of the LNA system 150 can be as described herein.

Figure 7A:
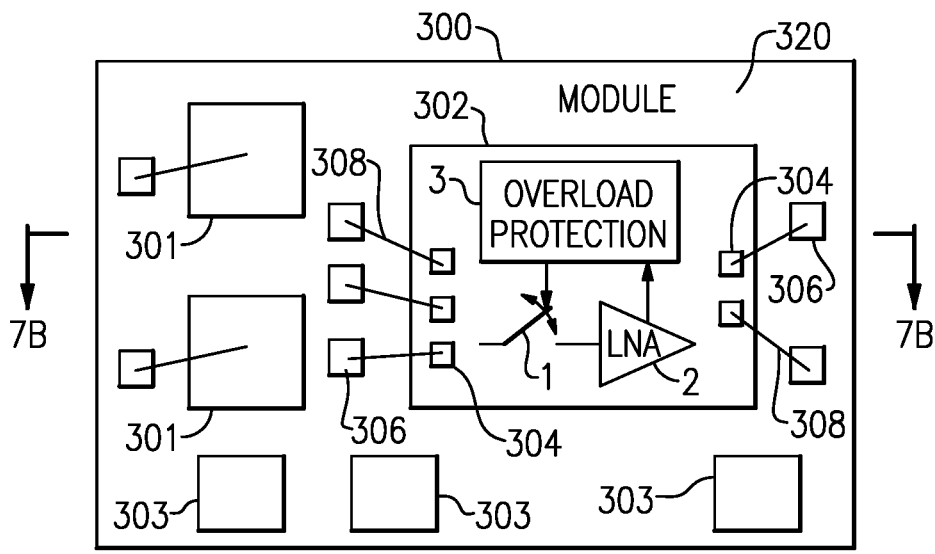
FIG. 7A is a schematic diagram of one embodiment of a packaged module.
Figure 7B:
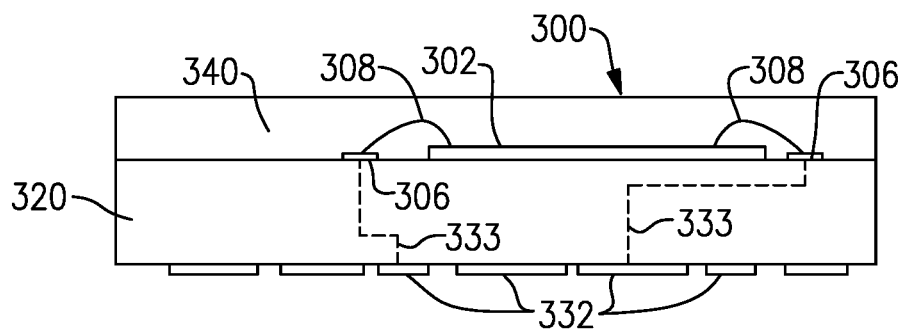
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes a semiconductor die 301, surface mount components 303, wirebonds 308, a package substrate 320, and encapsulation structure 340. The package substrate 320 includes pads 306 formed from conductors disposed therein. Additionally, the semiconductor die 301 includes pins or pads 304, and the wirebonds 308 have been used to connect the pads 304 of the die 301 to the pads 306 of the package substrate 301.

The semiconductor die 301 includes an input switch 1, an LNA 2, and an overload protection circuit 3, which can be as described earlier. In certain implementations, the semiconductor die 301 further a limiter enable circuit and/or a power amplifier formed thereon.

The packaging substrate 320 can be configured to receive a plurality of components such as the semiconductor die 301 and the surface mount components 303, which can include, for example, surface mount capacitors and/or inductors.

As shown in FIG. 7B, the packaged module 300 is shown to include a plurality of contact pads 332 disposed on the side of the packaged module 300 opposite the side used to mount the semiconductor die 301. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor die 301 and/or the surface mount components 303. As shown in FIG. 7B, the electrical connections between the contact pads 332 and the semiconductor die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

An RF front end system can include circuits in a signal path between an antennas and a baseband system. Some RF front ends can include circuits in signal paths between one or more antennas and a mixer configured to modulate a signal to RF or to demodulate an RF signal.

Figure 8A:
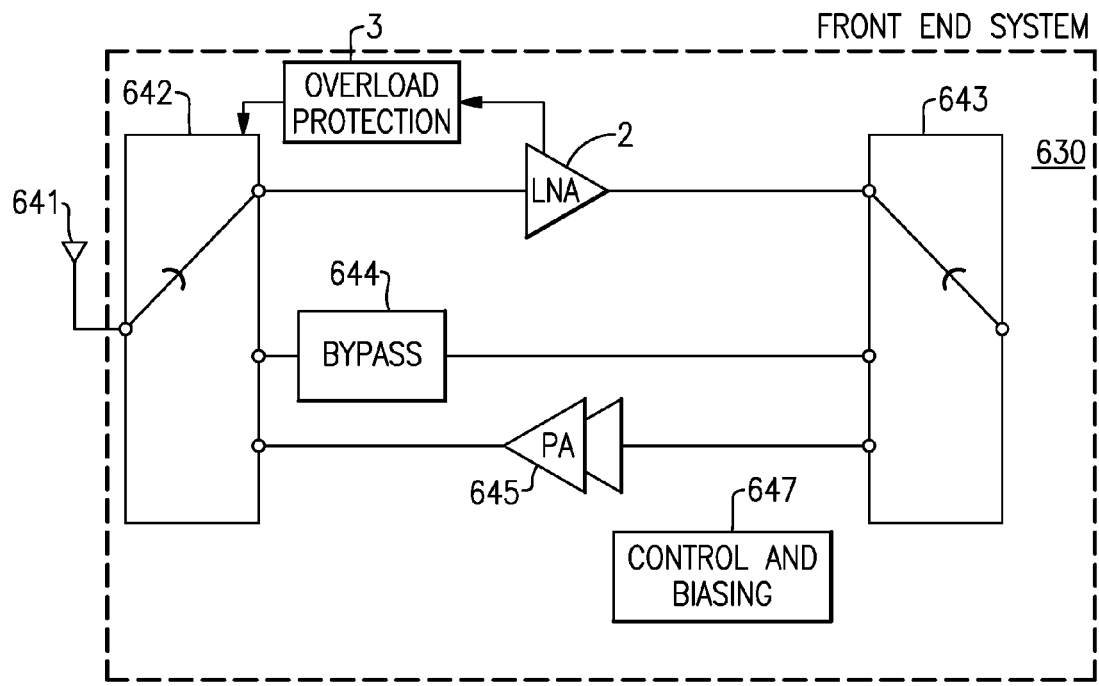
FIG. 8A is a schematic diagram of a front end system according to one embodiment.

FIG. 8A is a schematic diagram of a front end system 630 according to one embodiment.

The RF front end system 630 is configured to receive RF signals from an antenna 641 and to transmit RF signals by way of the antenna 641. The illustrated front end system 630 includes a first multi-throw switch 642, a second multi-throw switch 643, a receive signal path that includes an LNA 2 and an overload protection circuit 3, a bypass signal path that includes a bypass network 644, and a transmit signal path that includes a power amplifier 645. The overload protection circuit 3 can be implemented in accordance with any of the principles and advantages discussed herein. The bypass network 644 can include any suitable network for matching and/or bypassing the receive signal path and the transmit signal path. The bypass network 644 can be implemented by a passive impedance network or by a conductive trace or wire. The power amplifier 645 can be implemented in a wide variety of ways.

The first multi-throw switch 642 can selectively connect a particular signal path to the antenna 641. The first multi-throw switch 642 can electrically connect the receive signal path to the antenna 641 in a first state, electrically connect the bypass signal path to the antenna 641 in a second state, and electrically connect the transmit signal path to the antenna 641 in a third state. As shown in FIG. 8A, the first multi-throw switch 642 receives an output or feedback signal from the overload protection circuit 3. When the first multi-throw switch 642 selects the receive signal path including the LNA 2, the feedback signal is used to control an impedance of the switch 642 between the antenna 641 and the input to the LNA 2.

The second multi-throw switch 643 can selectively connect a particular signal path to an input/output port of the front end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front end system 630.

The control and biasing circuit 647 can be used to control and bias circuitry of the RF front end system 630, including, but not limited to, the overload protection circuit 3, the LNA 2, and/or the multi-throw switch 641.

Figure 8B:
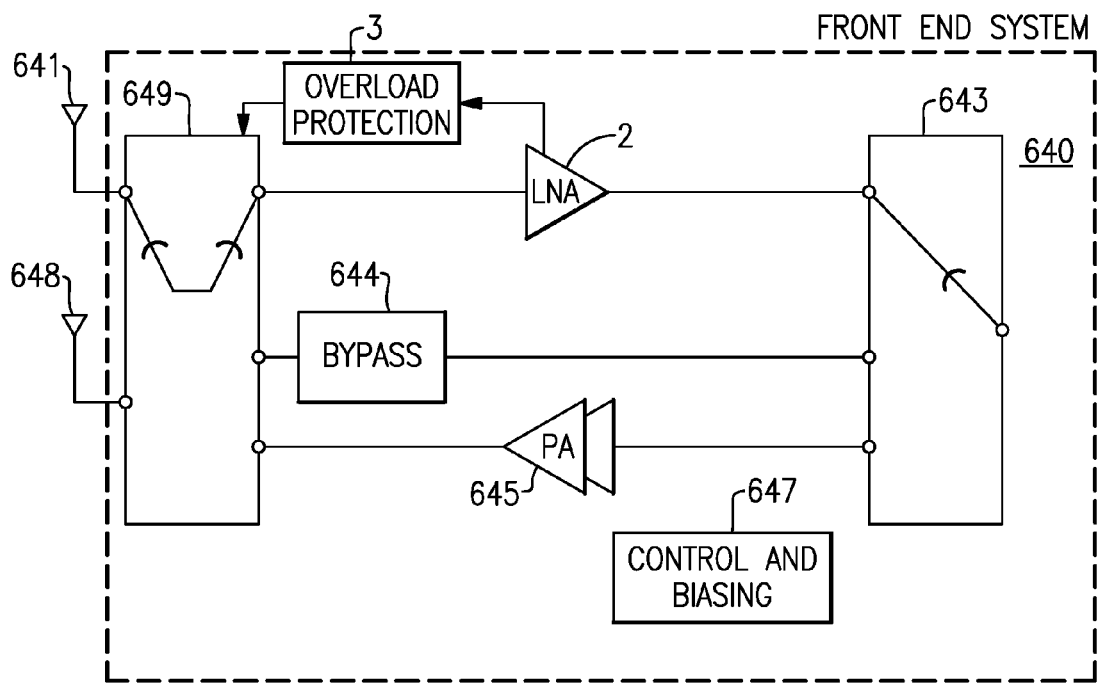
FIG. 8B is a schematic diagram of a front end system according to another embodiment.

FIG. 8B is a schematic diagram of a front end system 640 according to another embodiment.

The RF front end system 640 of FIG. 8B is similar to the RF front end system 630 of FIG. 8A, except that the first multi-throw switch 649 is configured to selectively connect a particular signal path to either a first antenna 641 or a second antenna 648. The multi-throw switch 649 can be a multi-throw, multi-pole switch.

The front end systems of FIGS. 8A and/or 8B can be implemented in a packaged module. Such packaged modules can include relatively low cost laminate-based front end modules that combine low noise amplifiers with power amplifiers and/or switch functions. Some such packaged modules can be multi-chip modules. In certain implementations, some or the all of the illustrated components in any of the front end systems in FIGS. 8A and/or 8B can be embodied on a single integrated circuit or die. Such a die can be manufactured using any suitable process technology. As one example, the die can be a semiconductor-on-insulator die, such as a silicon-on-insulator (SOI) die. According to some implementations, one or more antennas can be integrated with any of the front end systems discussed herein.

Figure 9A:
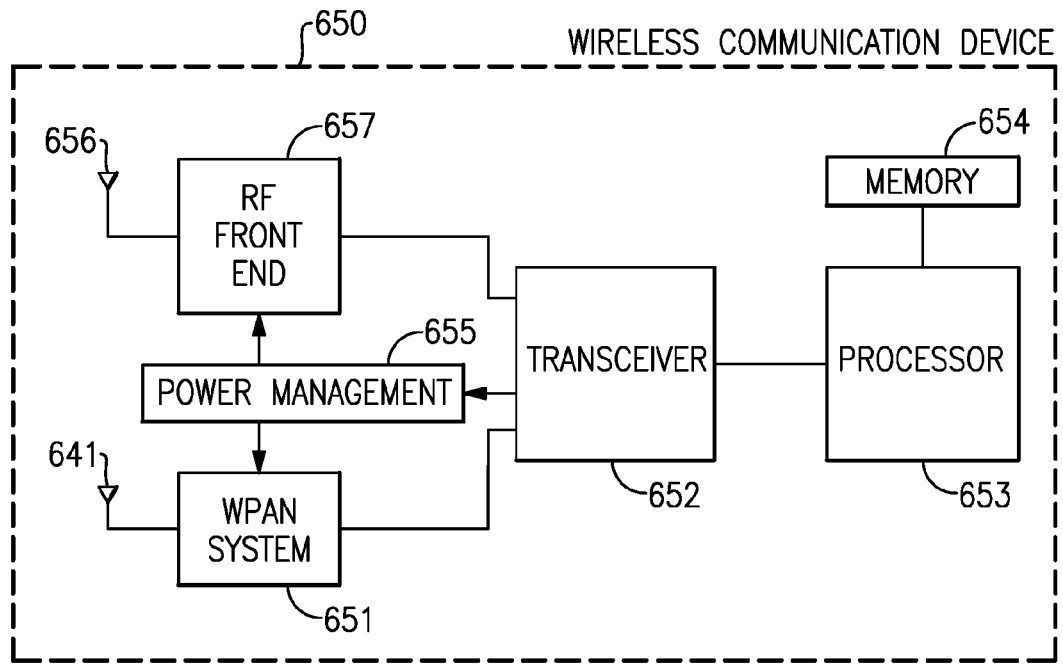
FIG. 9A is a schematic diagram of a wireless communication device according to one embodiment.
Figure 9B:
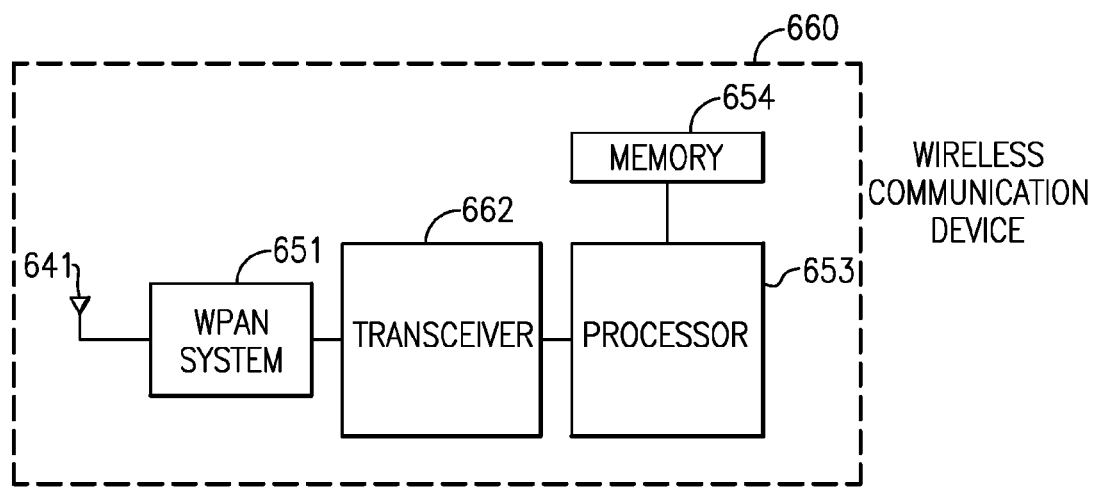
FIG. 9B is a schematic diagram of a wireless communication device according to another embodiment.

FIGS. 9A and 9B are schematic block diagrams of illustrative wireless communication devices that include an LNA and/or a front end system in accordance with one or more embodiments. The wireless communication devices can be any suitable wireless communication device. For instance, this device can be a mobile phone, such as a smart phone.

FIG. 9A is a schematic diagram of a wireless communication device 650 according to one embodiment.

As illustrated, the wireless communication device 650 includes a first antenna 641, a wireless personal area network (WPAN) system 651, a transceiver 652, a processor 653, a memory 654, a power management block 655, a second antenna 656, and an RF front end system 657. Any of the overload protection schemes discussed herein can be implemented in the WPAN system 651 and/or the RF front end system 657. The WPAN system 651 is an RF front end system configured for processing RF signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

FIG. 9B is a schematic diagram of a wireless communication device 660 according to another embodiment.

The illustrated wireless communication device 660 of FIG. 9B is a device configured to communicate over a PAN. This wireless communication device can be relatively less complex than the wireless communication device 650 of FIG. 9A. As illustrated, the wireless communication device 660 includes an antenna 641, a WPAN system 651, a transceiver 662, a processor 653, and a memory 654. The WPAN system 660 can include a low noise amplifier with an overload protection circuit in accordance with any of the principles and advantages discussed herein.

Figure 10:
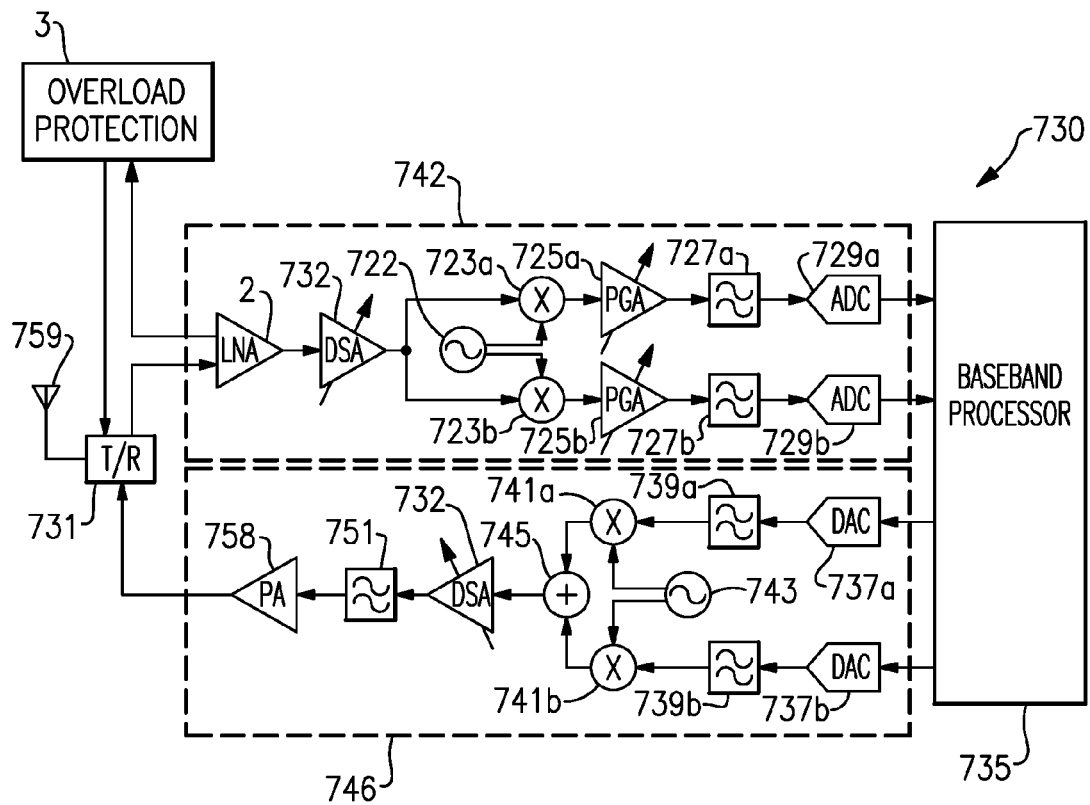
FIG. 10 is a schematic diagram of one embodiment of an RF system.

FIG. 10 is a schematic diagram of one embodiment of an RF system 730. The RF system 730 includes an overload protection circuit 3, a baseband processor 735, a receive path 742, a transmit path 746, a T/R switch 731, and an antenna 759. The RF system 700 illustrates one example of a communications system architecture that can include one or more LNAs implemented in accordance with the teachings herein.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit path 746 and the receive path 742 can be used for transmitting and receiving signals over the antenna 759. Although one implementation of the RF system 730 is illustrated in FIG. 10, the RF system 730 can be modified in any suitable manner. For example, the base station 730 can be modified to include additional transmit paths, receive paths, and/or antennas.

In the illustrated configuration, the receive path 742 includes a low noise amplifier (LNA) 2, a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive path is illustrated in FIG. 10, a receive path can include more or fewer components and/or a different arrangement of components.

An RF signal can be received on the antenna 759 and provided to the receive path 742 using the T/R switch 731. For example, the T/R switch 731 can be controlled to electrically couple the antenna 759 to an input of the LNA 2, thereby providing the received RF signal to the LNA's input. The LNA 2 provides low noise amplification such that the LNA 2 amplifies the received RF signal while adding or introducing a relatively small amount of noise.

In the illustrated embodiment, the overload protection circuit 3 provides feedback to an analog control input of the T/R switch 731 based on detecting a signal level of the low noise amplifier LNA 2.

As shown in FIG. 10, the amplified RF signal generated by the LNA 2 is provided to the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 735 for processing.

The baseband processor 735 can be implemented in a variety of ways. For instance, the baseband processor 735 can include a digital signal processor, a microprocessor, a programmable core, the like, or any combination thereof. Moreover, in some implementations, two or more baseband processors can be included in the RF system 730.

As shown in FIG. 10, the transmit path 746 receives data from the baseband processor 735 and is used to transmit RF signals via the antenna 759. The transmit path 746 and the receive path 742 both operate using the antenna 759, and access to the antenna 759 is controlled using the T/R switch 731. The illustrated transmit path 746 includes first and second digital-to-analog converters (DACs) 737a, 737b, first and second filters 739a, 739b, first and second mixers 741a, 741b, a local oscillator 743, a combiner 745, a DSA 732, an output filter 751, and a power amplifier 758. Although one implementation of a transmit path is illustrated in FIG. 10, a transmit path can include more or fewer components and/or a different arrangement of components.

The baseband processor 735 can output a digital in-phase (I) signal and a digital quadrature-phase (Q) signal, which can be separately processed until they are combined using the combiner 745. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 745 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 can be amplified by a power amplifier 758. In some implementations, the power amplifier 758 includes a plurality of stages cascaded to achieve a target gain. The power amplifier 758 can provide an amplified RF signal to the antenna 759 through the T/R switch 731.

Although FIGS. 7A-10 illustrate examples of electronic systems that can include an LNA implemented in accordance with the teachings herein, LNA can be used in other configurations of electronics.

Applications

Some of the embodiments described above have provided examples in connection with low noise amplifiers, front end modules and/or wireless communications devices. However, the principles and advantages of the embodiments can be used for any other systems or apparatus that benefit from any of the circuits described herein.

For example, LNAs can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A low noise amplifier system comprising:
   an input switch having an analog control input operable to control an impedance of the input switch;
   a low noise amplifier configured to provide amplification to a radio frequency input signal received from the input switch;
   an overload protection circuit configured to provide feedback to the analog control input of the input switch based on a detected signal level of the low noise amplifier; and
   a limiter enable circuit configured to selectively connect an output of the overload protection circuit to the analog control input based on a switch enable signal, the limiter enable circuit operable to disconnect the output of the overload protection circuit from the analog control input and turn off the input switch when the switch enable signal is in a disabled state.

2. The low noise amplifier system of claim 1 wherein the overload protection circuit is configured to increase the impedance of the input switch to reduce a magnitude of the radio frequency input signal in response to determining that the detected signal level indicates an overload condition.

3. The low noise amplifier system of claim 1 wherein the limiter enable circuit is further configured to selectively connect the output of the overload protection circuit to the analog control input based on a state of a limiter enable signal.

4. The low noise amplifier system of claim 1 wherein the overload protection circuit includes a detector configured to generate a detection signal indicating the detected signal level of the low noise amplifier, and an error amplifier configured to provide feedback to the analog control input based on amplifying a difference between the detection signal and a reference signal.

5. A low noise amplifier system comprising:
   an input switch having an analog control input operable to control an impedance of the input switch;
   a low noise amplifier configured to provide amplification to a radio frequency input signal received from the input switch; and
   an overload protection circuit configured to provide feedback to the analog control input of the input switch based on a detected signal level of the low noise amplifier, the overload protection circuit including a detector configured to generate a detection signal indicating the detected signal level of the low noise amplifier, and an error amplifier configured to provide feedback to the analog control input based on amplifying a difference between the detection signal and a reference signal, the detector including a bipolar transistor configured to saturate in response to an overload condition of the low noise amplifier.

6. The low noise amplifier system of claim 5 wherein the detector further includes a capacitor configured to filter a current flowing through the bipolar transistor, the detector configured to generate the detection signal based on a voltage across the capacitor.

7. The low noise amplifier system of claim 1 wherein the detected signal level includes an output signal level of the low noise amplifier.

8. The low noise amplifier system of claim 1 wherein the detected signal level includes an internal signal level of the low noise amplifier.

9. A packaged front end module comprising:
   a packaging substrate; and
   an integrated circuit attached to the packaging substrate, the integrated circuit including an input switch having an analog control input operable to control an impedance of the input switch, a low noise amplifier configured to provide amplification to a radio frequency input signal received from a first throw of the input switch, an overload protection circuit configured to provide feedback to the analog control input of the input switch based on a detected signal level of the low noise amplifier, and a limiter enable circuit configured to selectively connect an output of the overload protection circuit to the analog control input based on a switch enable signal, the limiter enable circuit operable to disconnect the output of the overload protection circuit from the analog control input and turn off the input switch when the switch enable signal is in a disabled state.

10. The packaged front end module of claim 9 wherein the overload protection circuit is configured to increase the impedance of the input switch to reduce a magnitude of the radio frequency input signal in response to determining that the detected signal level indicates an overload condition.

11. The packaged front end module of claim 9 wherein the limiter enable circuit is further configured to selectively connect the output of the overload protection circuit to the analog control input based on a state of a limiter enable signal.

12. The packaged front end module of claim 9 wherein the overload protection circuit includes a detector configured to generate a detection signal indicating the detected signal level of the low noise amplifier, and an error amplifier configured to provide feedback to the analog control input based on amplifying a difference between the detection signal and a reference signal.

13. The packaged front end module of claim 9 wherein the integrated circuit further includes a bypass path electrically connected to a second throw of the input switch.

14. The packaged front end module of claim 13 wherein the integrated circuit further includes a power amplifier configured to provide an amplified radio frequency signal to a third throw of the input switch.

15. The low noise amplifier system of claim 5 wherein the overload protection circuit is configured to increase the impedance of the input switch to reduce a magnitude of the radio frequency input signal in response to determining that the detected signal level indicates an overload condition.

16. The low noise amplifier system of claim 5 wherein the detected signal level includes an output signal level of the low noise amplifier.

17. The low noise amplifier system of claim 5 wherein the detected signal level includes an internal signal level of the low noise amplifier.

18. The low noise amplifier system of claim 5 further comprising a limiter enable circuit configured to selectively connect an output of the overload protection circuit to the analog control input.

19. The low noise amplifier system of claim 18 wherein the limiter enable circuit is configured to receive a switch enable signal, and to disconnect the output of the overload protection circuit from the analog control input and turn off the input switch when the switch enable signal is in a disabled state.

20. The low noise amplifier system of claim 19 wherein the limiter enable circuit is configured to receive a limiter enable signal, and to disconnect the output of the overload protection circuit from the analog control input when the limiter enable signal is in a disabled state.

* * * * *